(12) United States Patent
Kelley

(10) Patent No.: US 10,720,372 B2
(45) Date of Patent: Jul. 21, 2020

(54) CONDUCTION COOLING FOR CIRCUIT BOARDS

(71) Applicant: Microsoft Technology Licensing, LLC, Redmond, WA (US)

(72) Inventor: Douglas Patrick Kelley, Issaquah, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/172,147

(22) Filed: Oct. 26, 2018

(65) Prior Publication Data

US 2020/0135608 A1 Apr. 30, 2020

(51) Int. Cl.
| | |
|---|---|
| *H01L 23/14* | (2006.01) |
| *H01L 23/367* | (2006.01) |
| *H01L 21/48* | (2006.01) |
| *H01L 23/373* | (2006.01) |
| H01L 39/02 | (2006.01) |

(52) U.S. Cl.
CPC ........ *H01L 23/367* (2013.01); *H01L 21/4882* (2013.01); *H01L 23/147* (2013.01); *H01L 23/3735* (2013.01); *H01L 39/02* (2013.01)

(58) Field of Classification Search
None
See application file for complete search history.

(56) References Cited

U.S. PATENT DOCUMENTS

| | | | |
|---|---|---|---|
| 5,006,505 A | 4/1991 | Skertic | |
| 5,309,088 A | 5/1994 | Chen | |
| 5,396,403 A | 3/1995 | Patel | |
| 7,005,320 B2 | 2/2006 | Kwon | |
| 7,416,922 B2 | 8/2008 | Houle et al. | |
| 7,508,670 B1 | 3/2009 | Thorson et al. | |
| 8,081,474 B1 | 12/2011 | Zohni et al. | |

(Continued)

OTHER PUBLICATIONS

Akins, et al., "Thermal Conductivity of Indium Bonded Silicon", Retrieved from: https://web.archive.org/web/20171026015432/http:/www.phys.ufl.edu/ireu/IREU2015/pdf_reports/Dallas_Akins_Roma_Paola_Puppo_Paper.pdf, Oct. 26, 2017, pp. 1-14.

(Continued)

*Primary Examiner* — Bilkis Jahan
(74) *Attorney, Agent, or Firm* — Withrow & Terranova, P.L.L.C.

(57) ABSTRACT

Disclosed is a cooling assembly for circuit boards. In one embodiment, the assembly includes a circuit board that is thermally and physically coupled to a heat spreader by a thermal interface. In one configuration, the circuit board is formed from a semiconductor material and includes a first board surface on which integrated circuits are mounted and a second board surface opposite the first board surface. The heat spreader is formed from a thermally conductive material and includes a plurality of vanes that are spaced apart from one another. The thermal interface is coupled between at least one area of the second board surface of the circuit board and a contact area of each of the plurality of vanes. Heat generated by the integrated circuits is conducted from at least one integrated circuit to the plurality of vanes of the heat spreader through the circuit board and the thermal interface.

14 Claims, 15 Drawing Sheets

(56) References Cited

U.S. PATENT DOCUMENTS

| | | | |
|---|---|---|---|
| 8,421,235 B2* | 4/2013 | Ide | H01L 23/473 257/675 |
| 8,547,699 B1* | 10/2013 | McCleary | H05K 7/20445 165/104.33 |
| 9,468,136 B2 | 10/2016 | Ross et al. | |
| 9,497,888 B2 | 11/2016 | Arvelo et al. | |
| 2013/0141866 A1 | 6/2013 | Refai-ahmed | |
| 2015/0342023 A1 | 11/2015 | Refai-ahmed et al. | |
| 2018/0241285 A1* | 8/2018 | Sasaki | H02K 9/005 |

OTHER PUBLICATIONS

Tugnawat, et al., "Low Temperature Performance of COTS Electronic Components for Future MARS Missions", In Proceedings of 12th NASA Symposium on VLSI Design, Oct. 4, 2005, pp. 1-9.
"International Search Report and Written Opinion Issued in PCT Application No. PCT/US2019/055750", dated Jan. 20, 2020, 14 pages.

* cited by examiner

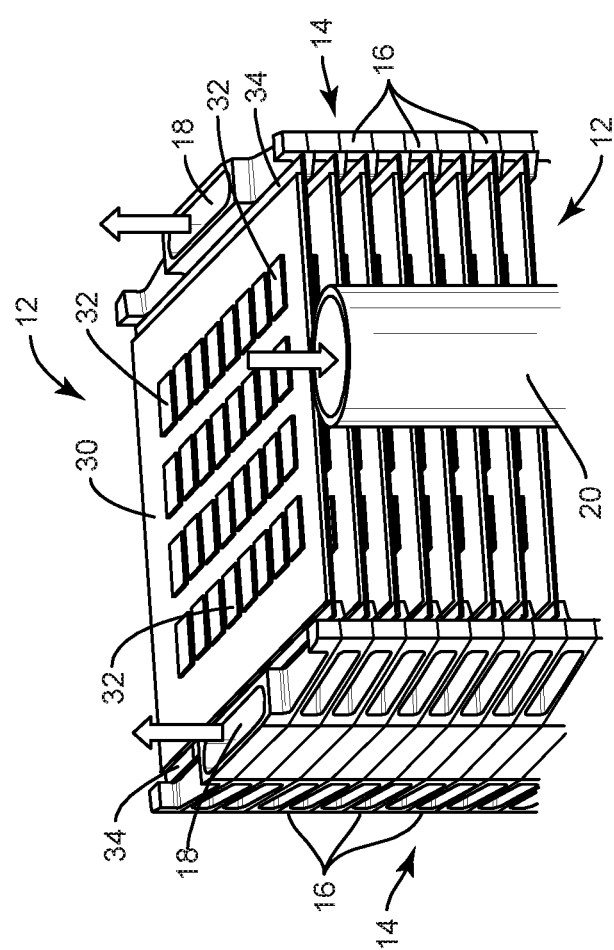
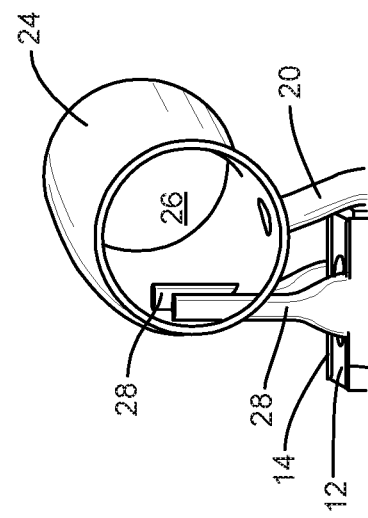
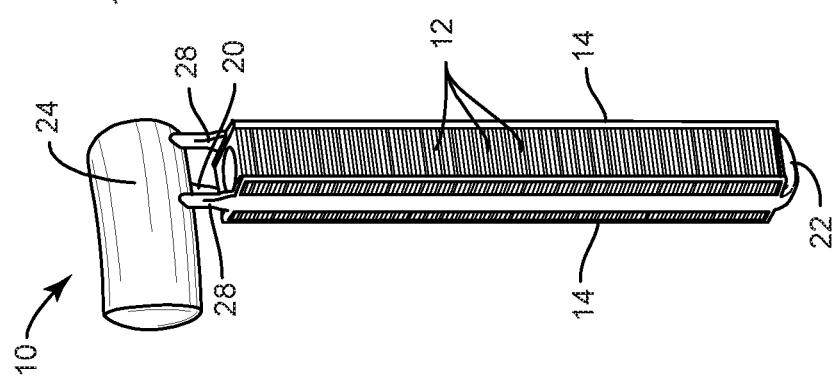
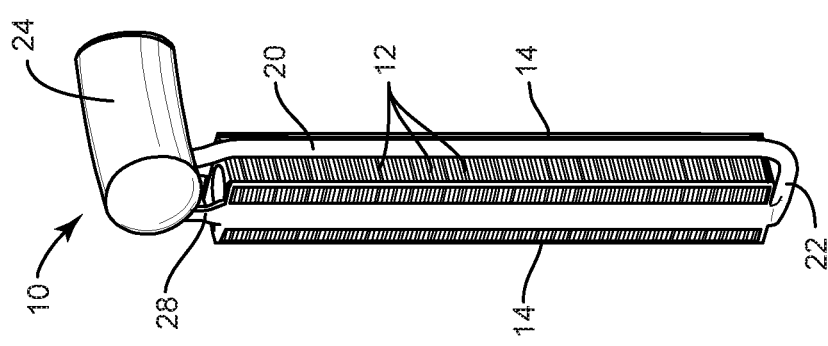

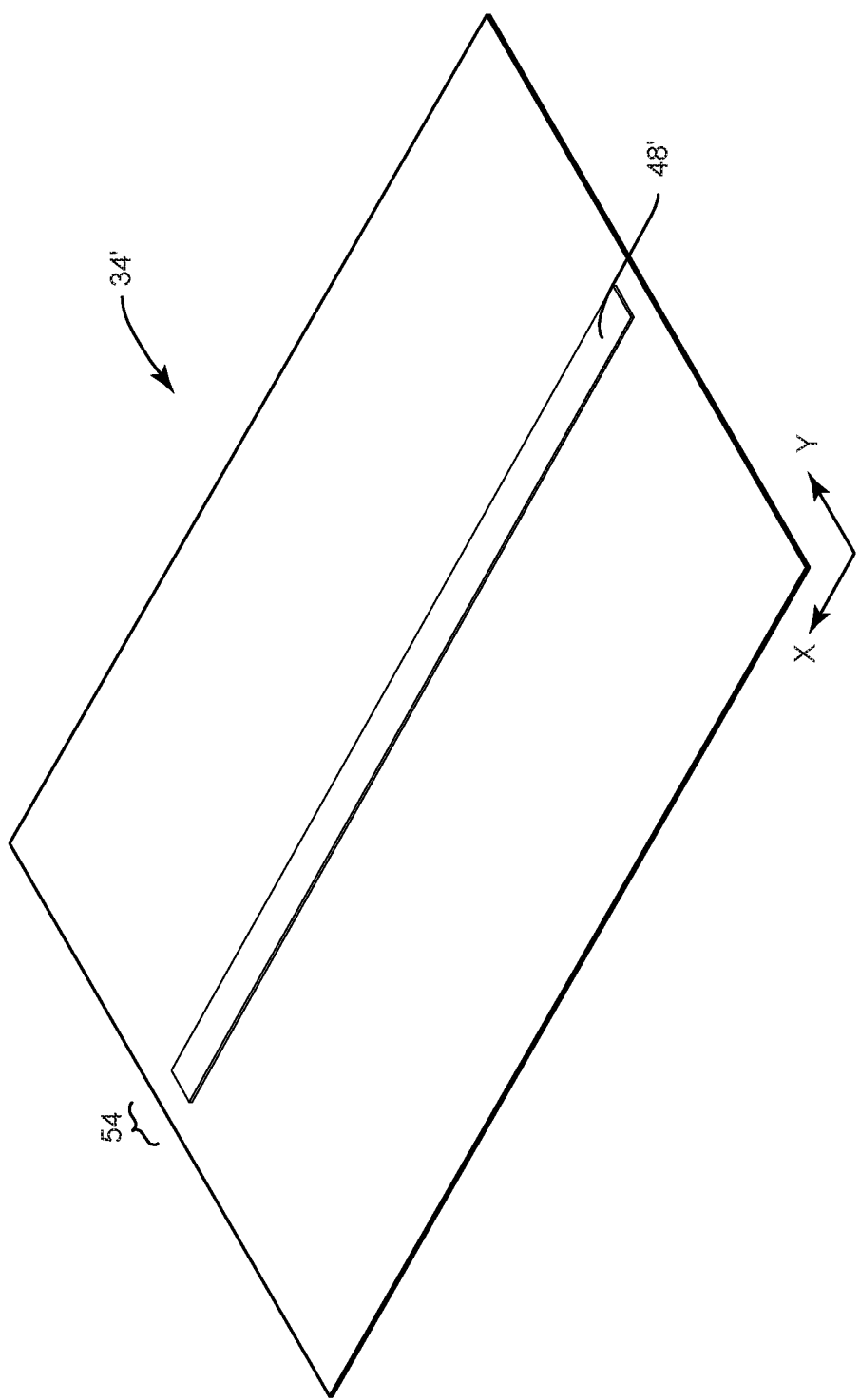

CONDUCTION COOLING FOR CIRCUIT BOARDS

FIELD OF THE DISCLOSURE

The present disclosure relates to circuit boards and in particular to conduction cooling for circuit boards.

BACKGROUND

Many supercomputing applications employ super conducting circuits that are predominantly implemented in integrated circuits. These integrated circuits often perform best when operating in a cryogenic environment that is maintained at or near cryogenic temperatures, which may extend down to or below 4 (four) Kelvin (K).

In a cryogenic environment, the circuit boards on which the integrated circuits reside generally operate in a medium to high vacuum to avoid convective heat leakage and various gasses condensing on the surface of the circuit boards and the integrated circuits residing thereon. This leaves conduction as the main method of removing heat from the integrated circuits. The heat generated from the integrated circuits can be transmitted through the solder connections (i.e. a ball grid array) to a circuit board and then to a heat sink, which is made of aluminum, copper, or like material that is highly thermally conductive.

Unfortunately, the materials used for the integrated circuits, the circuit boards, and the heatsinks are different and have widely varying coefficients of thermal expansion (CTEs). The thermal contraction and expansion associated with cycling the system between 293 K to 0 K are extreme and vary from material to material. As a result, the integrated circuits may be damaged and/or break loose from the circuit boards to which they are attached. The expansion and contraction of the heatsinks at different rates than the circuit board may fracture the circuit boards under compressive and/or tensile stresses as well as break the thermal bond between the circuit boards and heat sinks. Any damage to the integrated circuits, circuit boards, or electrical connections therebetween leads to failure of the overall system. Further, a failure in the thermal bond between the circuit board and the heat sink may lead to overheating and failure of the integrated circuits and/or the circuit boards.

SUMMARY

Disclosed is a cooling assembly for circuit boards. In one embodiment, the assembly includes a circuit board that is thermally and physically coupled to a heat spreader by a thermal interface. In one configuration, the circuit board is formed from a semiconductor material and includes a first board surface on which integrated circuits are mounted and a second board surface opposite the first board surface. The heat spreader is formed from a thermally conductive material and includes a plurality of vanes that are spaced apart from one another. The thermal interface is coupled between at least one area of the second board surface of the circuit board and a contact area of each of the plurality of vanes. Heat generated by the integrated circuits is conducted from at least one integrated circuit to the plurality of vanes of the heat spreader through the circuit board and the thermal interface.

In certain embodiments, thermal interface is at least 85%, 90%, or 95% indium, wherein alloys of indium are also applicable, and/or the heat spreader is at least 99.99% aluminum. The thermal interface may be a single layer or multiple layers. If the thermal interface includes multiple layers, one layer may be of indium, zinc, copper, or the like, with a purity of at least 90% or 95%. The overall thickness of the thermal interface may be less than 0.05 mm-0.3 mm or 0.1 mm-0.2 mm thick. The integrated circuit and the circuit board may be formed from silicon, silicon carbide, or the like, and have a thickness of 0.05 mm-2.0 mm. Further, the contact areas for each of the plurality of vanes may be the only portions of the thermal interface in contact with the heat spreader. The thermal interface may take various forms or shapes, including that of an elongated strip that resides exclusively within a central portion of the second board surface extending along a first axis, and has a length that is at least ten times the width.

In one embodiment, the above assembly is formed as follows. A circuit board is initially provided. The circuit board is formed from a semiconductor material and has a first board surface on which integrated circuits are mounted and a second board surface opposite the first board surface. A first thermal interface subsection is provided on a central portion of the second board surface of the circuit board.

Next, a heat spreader formed from of a thermally conductive material is provided. The heat spreader has a plurality of vanes that are spaced apart from one another by a plurality of slots. A second thermal interface subsection is formed on the heat spreader. The first thermal interface subsection is then bonded to the second thermal interface subsection to form a thermal interface, such that the circuit board is physically and thermally coupled to the heat spreader via the thermal interface. Heat generated by the integrated circuits is conducted from the integrated circuits to the plurality of vanes of the heat spreader through the circuit board and the thermal interface.

In one embodiment, providing the second thermal interface subsection on the heat spreader includes: forming an interface subsection precursor that resides on the plurality of vanes and spans the plurality of slots of the heat spreader, and removing the portions of the interface subsection precursor that reside over the plurality of slots to form the second thermal interface subsection.

The first thermal interface subsection and the second thermal interface subsection may be formed from a cold bondable material, such as indium or alloys thereof. Bonding the first thermal interface subsection to the second thermal interface subsection may include pressing the first thermal interface subsection against the second thermal interface subsection to bond the first thermal interface subsection to the second thermal interface subsection.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A is a front isometric view of a cooling chassis according to one embodiment.

FIG. 1B is a front isometric view of a cooling chassis according to one embodiment.

FIG. 1C is an enlarged isometric view of a section of the cooling chassis of FIGS. 1A and 1B.

FIG. 1D is a cross-sectional view of a phase separator of the cooling chassis of FIGS. 1A and 1B.

FIG. 5B is a top isometric view of a heat spreader after forming the thermal interface precursor according to one embodiment.

DETAILED DESCRIPTION

Figure 2A:
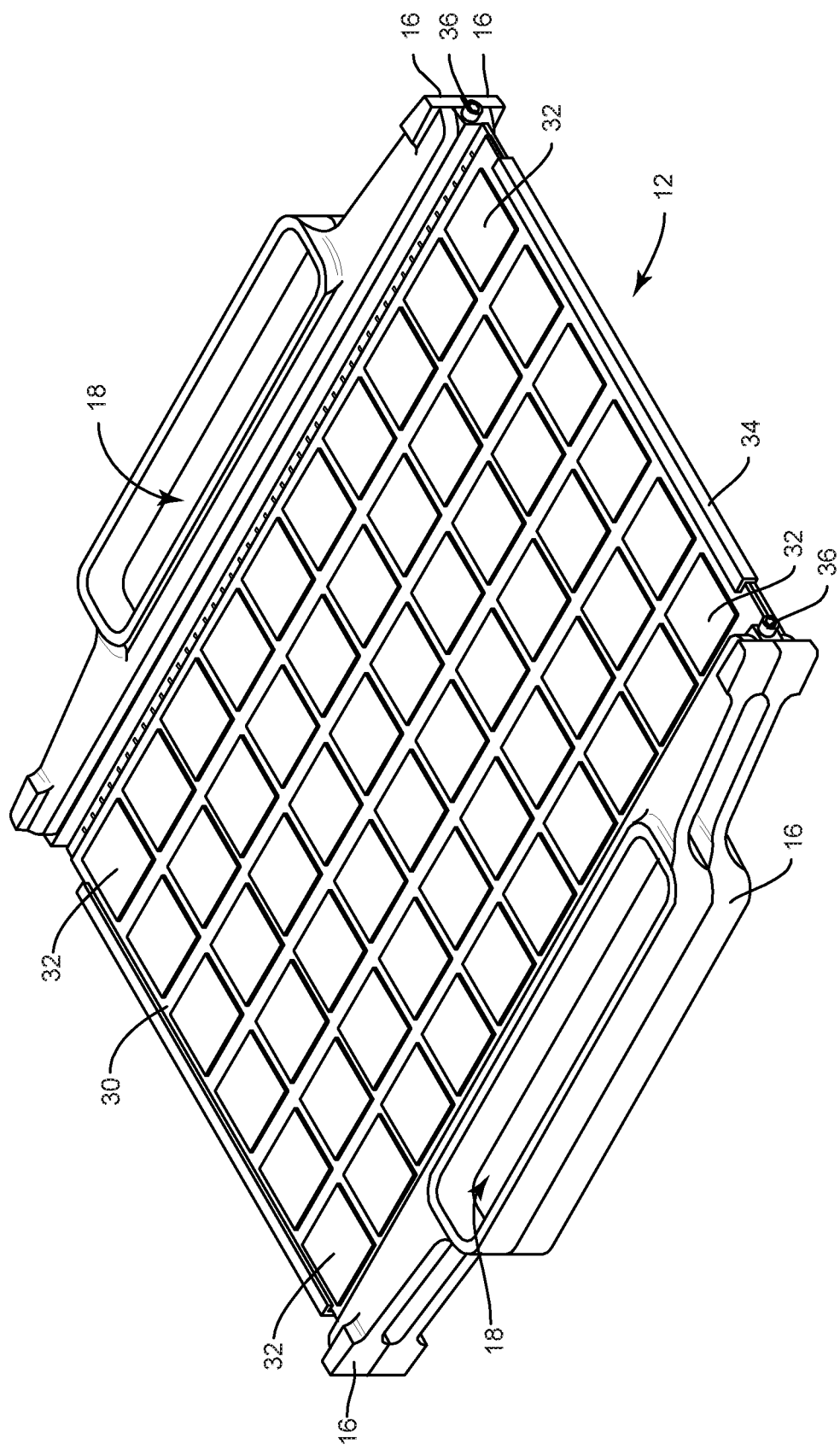
FIG. 2A is an isometric view of a blade assembly according to one embodiment.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

For the following description, attention is directed to FIGS. 1A-1D. With particular reference to FIGS. 1A and 1B, a thermosiphon cooling chassis 10, which is referred to hereinafter as simply a cooling chassis 10, is used to cool numerous blade assemblies 12, according to an exemplary embodiment. The blade assemblies 12 are mounted in parallel with one another in a stacked fashion within the cooling chassis 10. The cooling chassis 10 may be formed from a continuous machined assembly and is characterized by opposing chassis walls 14. The side walls 14 can be divided into numerous chassis segments 16. Within each chassis wall 14, a return channel 18 is formed to effectively provide a conduit that extends through the chassis segments 16.

A supply conduit 20 extends along the stack of the blade assemblies 12 and connects with the return channels 18 at the bottom of the chassis walls 14 via a conduit coupling 22. In the illustrated example, the conduit coupling 22 is a T-shaped coupling that provides fluid communication between the supply conduit 20 and both return channels 18 of the two chassis walls 14. With particular reference to FIG. 1D, the supply conduit 20 and the return channels 18 are in fluid communication with a phase separator 24. The phase separator 24 is tubular and provides an internal separation chamber 26, which is in fluid communication with each of the return channels 18 via return conduits 28 and the supply conduit 20.

In this embodiment, the supply conduit 20 is in fluid communication with a bottom portion of the phase separator 24 and does not extend into the separation chamber 26. The return conduits 28, which are in fluid communication with the return channels 18, extend into the separation chamber 26 and terminate at a level above that of the opening leading to the supply conduit 20. In other embodiments, the supply conduit 20 may extend into the separation chamber 26; however, the return conduits 28 may, but need not, rise to a level above that of the supply conduit 20. The reason for this configuration is provided further below.

The blade assemblies 12 include a circuit board 30 with numerous integrated circuits 32 and a heat spreader 34, which is illustrated in FIG. 1C. Each blade assembly 12 is mechanically and thermally coupled to the chassis walls 14 via the heat spreader 34. While details are provided further below, at a high level, the circuit board 30 is thermally coupled to the heat spreader 34, which is thermally coupled to the chassis segments 16 of the chassis walls 14. Heat generated by the integrated circuits 32 flows through the circuit board 30 to the heat spreader 34, which facilitates heat transfer to the chassis segments 16 of the chassis wall 14. The heat transferred to the chassis walls 14 is removed by circulating a low temperature fluid in a gas, liquid, or combination of gas and liquid states.

In one embodiment, liquid helium is provided in a bottom portion of the separation chamber 26 of the phase separator 24 and allowed to flow in a liquid state down the supply conduit 20. As the liquid helium passes through the conduit coupling 22 into the respective return channels 18 of the chassis walls 14, heat is transferred to the liquid helium from the chassis walls 14. The heat causes the liquid helium to develop bubbles, which effectively decreases the density of the liquid helium and causes the liquid helium in the return channels 18 to become less dense than the liquid helium in the supply conduit 20. As a result, the liquid helium will circulate through the system by flowing down the supply conduit 20 and up the return conduit. The bubbles separate from the liquid helium in the separation chamber 26, and as a result, the liquid helium pools in the lower portions of the separation chamber 26 before flowing downward through the supply conduit. Circulation of the helium through the supply conduit 20, the return channels 18, and the separation chamber 26 may occur naturally as long as the temperature of the helium is maintained at a proper level or facilitated through an additional pump, which is not illustrated. While helium is used in this example, other cooling fluids such as nitrogen, neon, oxygen and the like, may be employed.

FIG. 2A illustrates an enlarged view of a single blade assembly 12 mounted between respective pairs of chassis segments 16. Opposing edges of the heat spreader 34 are clamped between the respective pairs of chassis segments 16, wherein a locking mechanism 36 is used to both hold adjacent chassis segments 16 against one another as well as hold the heat spreader 34 in place. The opposing edges of the heat spreader 34 extend past the corresponding edges of the circuit board 30 to releasably engage each pair of chassis segments 16.

Figure 2B:
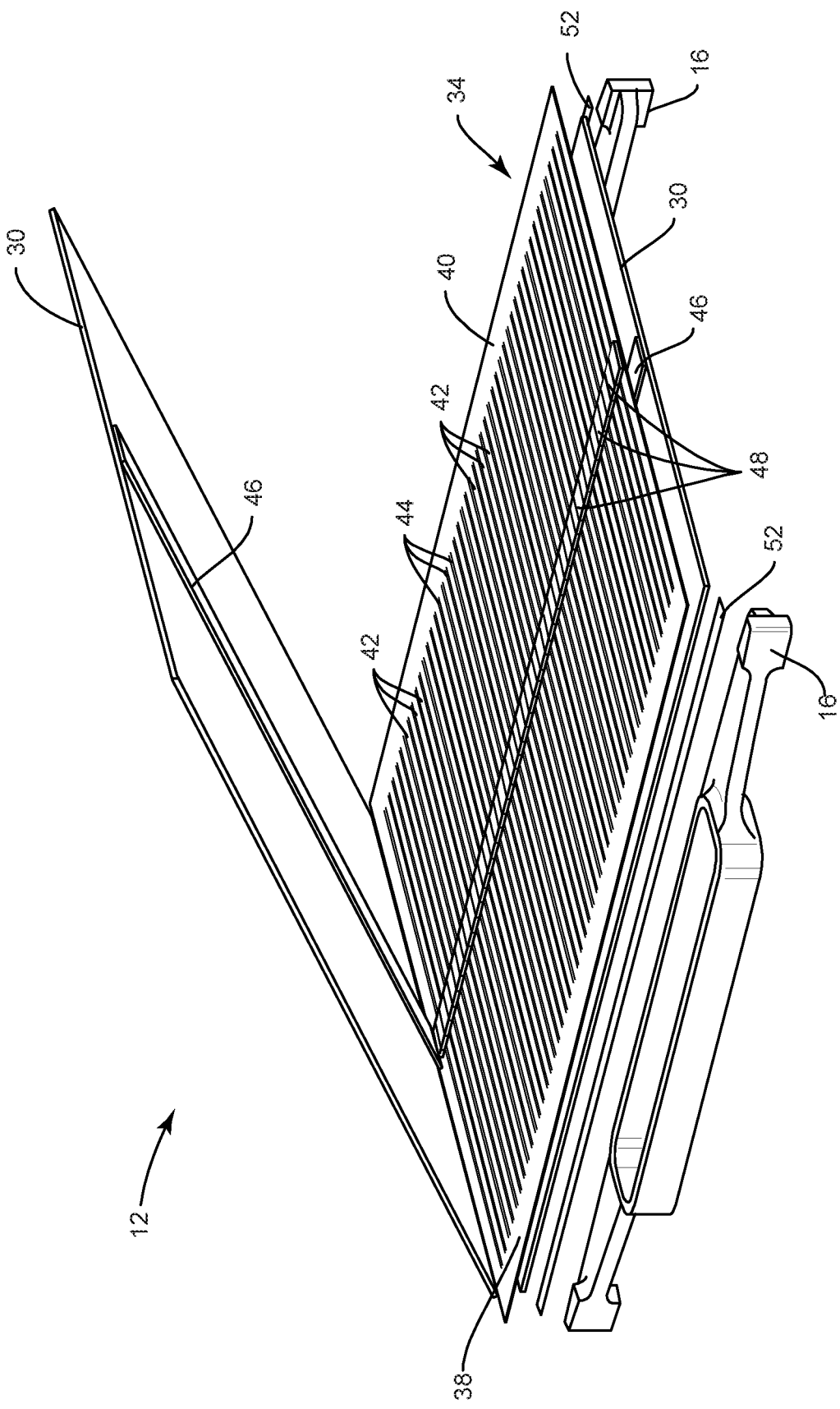
FIG. 2B is an exploded isometric view of the blade assembly of FIG. 2A.

FIG. 2B is an exploded isometric view of a blade assembly 12. In this embodiment, circuit boards 30 are mounted along both sides of the heat spreader 34. Further, the heat spreader 34 in this embodiment is characterized by a first bar 38, a second bar 40, and numerous vanes 42 that extend from the first bar 38 to the second bar 40. As illustrated, the vanes 42 are substantially in parallel with one another and separated by thin slots 44; however other configurations are envisioned.

The circuit boards 30 have opposing surfaces that will be generally referred to as a first surface and a second surface. The first surface is populated with the integrated circuits 32 and the second surface is the surface opposite that of the first surface. As illustrated in FIG. 2B, the second surface of the circuit board 30 includes a first thermal interface subsection 46 that aligns with a second thermal interface subsection 48, which is formed on the heat spreader 34. The second thermal interface subsection 48 may have multiple components, which are formed on the vanes 42 of the heat spreader 34.

As will be described in further detail below, when the circuit board 30 is placed on the heat spreader 34, the first thermal interface subsection 46 on the circuit board 30 will come into direct contact with the components of the second thermal interface subsection 48 on the heat spreader 34. The first thermal interface subsection 46 and the components of the second thermal interface subsection 48 join together to form an overall thermal interface 50 (not shown in FIG. 2B), which provides the primary thermal conduction path between the circuit board 30 and the vanes 42 of the heat spreader 34.

The first and second thermal interface subsections 46, 48 may be formed of the same or different materials, and may be thermally coupled in a variety of ways. A particularly effective technique is to form the first and second thermal interface subsections 46, 48 out of the same material, and then bond the first and second thermal interface subsections 46, 48 to one another to form an integrated thermal interface 50. A particularly effective material for the first and second thermal interface subsections 46, 48 is indium or an alloy thereof. In certain embodiments, the thermal interface is at least 85%, 90%, or 95% of indium. The thermal interface may be a single layer or multiple layers. If the thermal interface includes multiple layers, one layer may be of indium, zinc, copper, or the like, with a purity of at least 90% or 95%. The other layers may include, but are not limited to zinc, copper, and the like. The overall thickness of the thermal interface may be less than 0.05 mm-3 mm or 0.1 mm-0.2 mm thick. The integrated circuit and the circuit board may be formed from silicon, silicon carbide or the like, and have a thickness of 0.05 mm-2.0 mm.

Figure 2C:
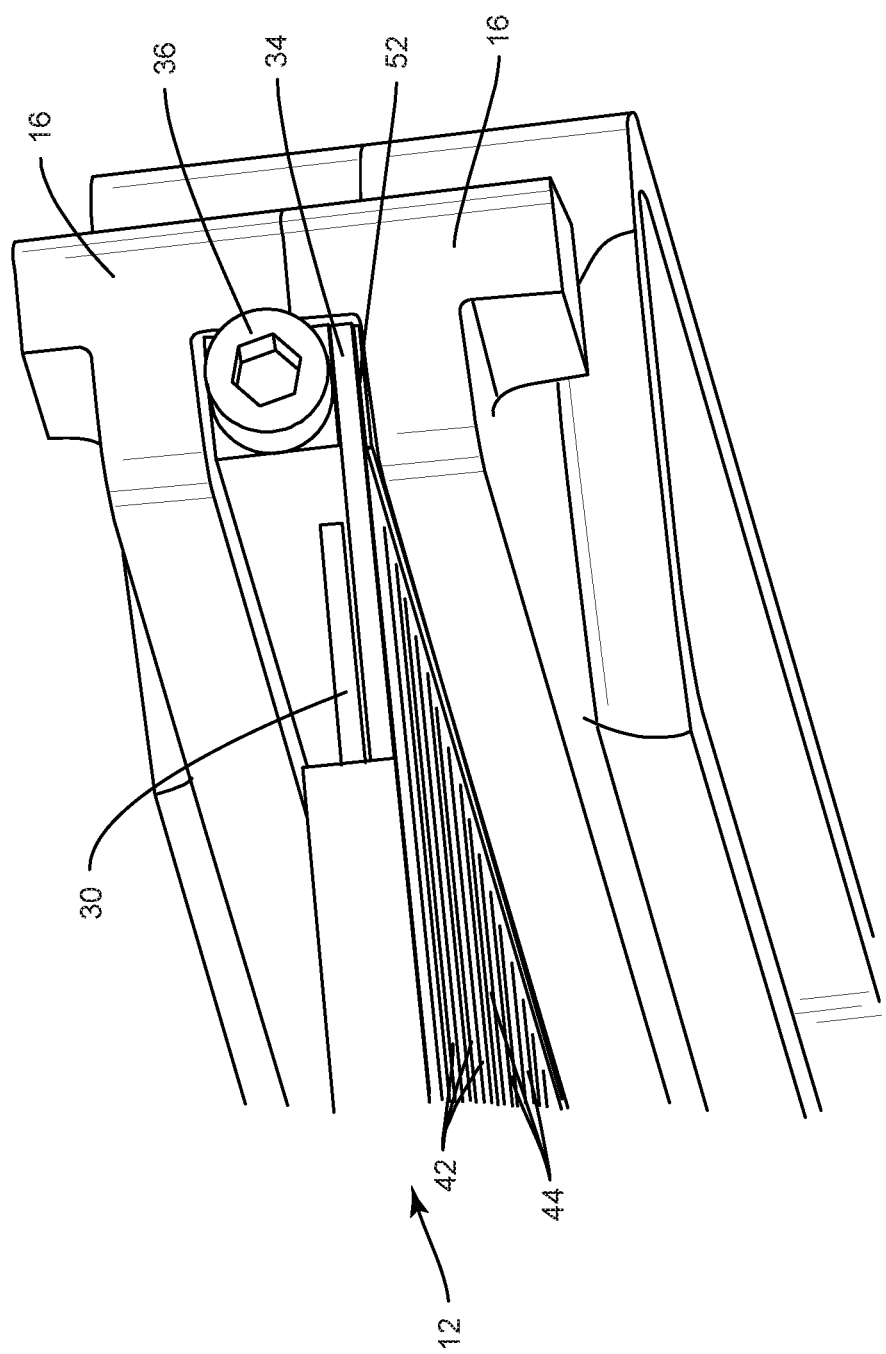
FIG. 2C is an enlarged isometric view of a portion of the blade assembly of FIG. 2A.

As illustrated in FIGS. 2B and 2C, edge interface strips 52 of indium or other highly conductive materials, such as thermally conductive epoxies and the like, may be used to provide efficient thermal coupling of the first and second bars 38, 40 of the heat spreader 34 to the chassis segments 16. For clarity, FIG. 2C does not illustrate a second circuit board 30 being coupled to the bottom side of the heat spreader 34.

Figure 3:
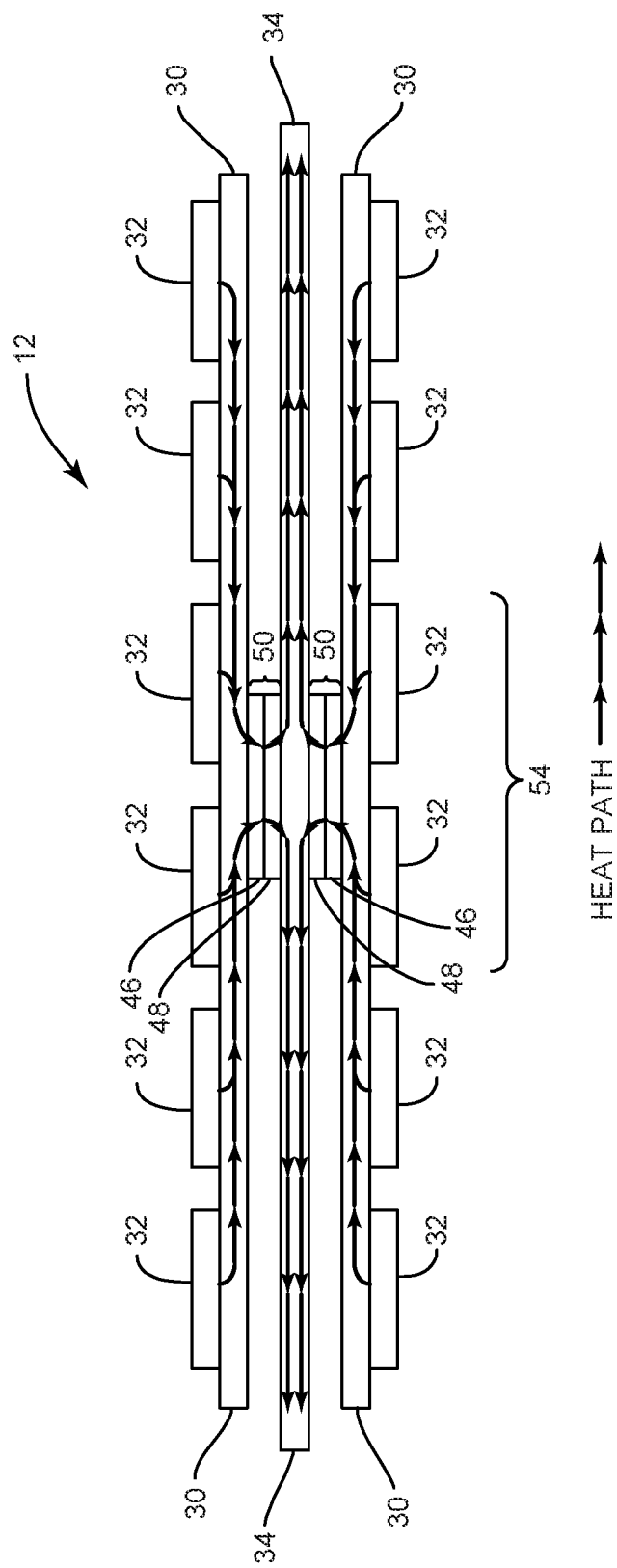
FIG. 3 is a cross-sectional view of a blade assembly according to one embodiment.

FIG. 3 illustrates a cross section of a blade assembly 12, wherein circuit boards 30 are mounted on both sides of the heat spreader 34. Each circuit board 30 is thermally and physically coupled to a respective surface of the heat spreader 34 via the thermal interface 50. In one embodiment, the thermal interface 50 resides within a central portion 54 of both the circuit boards 30 and the heat spreader 34. Further, the thermal interface 50 may provide only a single thermal contact area between the circuit board 30 and any one of the vanes 42 of the heat spreader 34. In other words, a thermal interface 50 only couples a single contact area on the surface of each vane 42 to the corresponding circuit board 30. The thermal interface 50 is configured such that the contact area is relatively small to minimize the negative effects of expansion and contraction of the circuit boards 30 and the heat spreader 34 due to changing temperatures. In essence, a centrally located thermal interface 50 absorbs the stresses associated with the different rates of expansion and contraction of the circuit boards 30 and the heat spreaders 34. While the thermal interface 50 may take various configurations, a narrow elongated strip that runs across the vanes 42 of the heat spreader 34 is particularly beneficial and inherently provides a single, relatively small contact area for each of the vanes 42. In one embodiment, the vanes 42 are substantially parallel to one another, and the thermal interface 50 runs substantially orthogonally to the vanes 42 and resides within a central portion 54 of the various vanes 42. As defined herein, a central portion 54 of either the heat spreader 34 or the circuit board 30 is considered to be confined within a central 20% (or smaller portion) of the respective component relative to one or two orthogonal axes. In other embodiments, the central portion 54 may be further limited to a central 15%, 10%, 7.5% or 5%.

The solid lines with periodic arrows represent the heat conduction path for the blade assembly 12. In particular, heat generated by the respective integrated circuits 32 flows into the circuit boards 30 and toward the corresponding thermal interfaces 50. The heat flows through the thermal interfaces 50 and then along the vanes 42 of the heat spreader 34 toward the outer edges of the heat spreader 34. At this point, the heat will flow into the chassis segments 16 and be dissipated into the cooling fluid flowing through the return channels 18 of the respective chassis walls 14.

A benefit of maintaining a single contact area on each vane 42 of the heat spreader 34 by the thermal interface 50 is to avoid confining a segment of the circuit board 30 between two points on a vane 42 of the heat spreader 34. Confining a portion of the circuit board 30 between two contact areas of a vane 42, especially if there is considerable distance between the two contact areas, will inherently subject that portion of the circuit board 30 to compressive and/or tensile stresses, which may result in crushing a portion of the circuit board 30 and/or pulling a portion of the circuit board 30 apart.

Figure 4A:
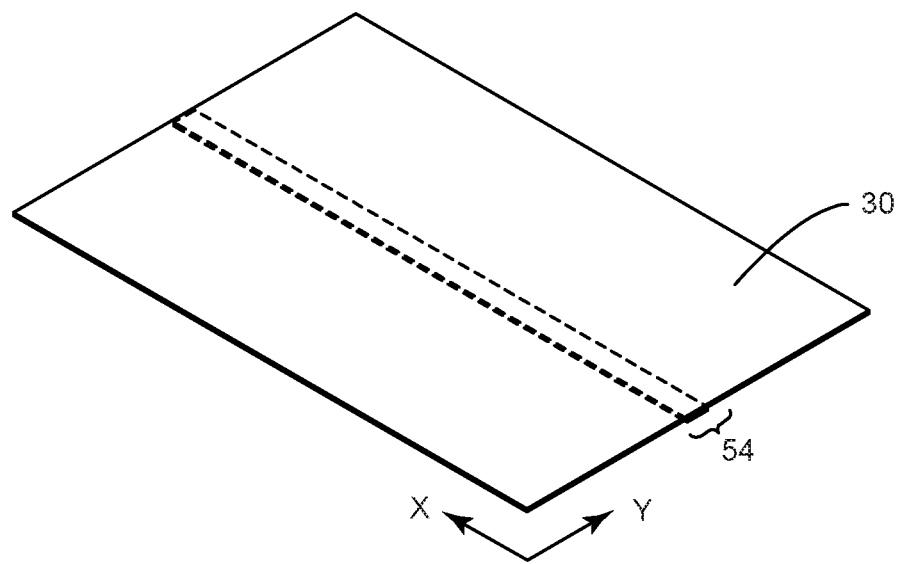
FIG. 4A is a bottom isometric view of a circuit board prior to forming the first thermal interface subsection according to one embodiment.

The following describes an exemplary process for fabricating a blade assembly 12. With reference to FIG. 4A, the back side of a circuit board 30 is illustrated, wherein the dashed lines define the area on which a strip of indium will be formed to provide the first thermal interface subsection 46 of the thermal interface 50. Notably, the circuit board 30 may have various compositions. In one embodiment, the circuit board 30 is a wafer board formed from a traditional semiconductor material, such as silicon, silicon carbide, silicon germanium, and the like. While not limited thereto, wafer board-based circuit boards 30 typically range in thickness from 0.35 mm to 2.5 mm. The examples described below assume that the circuit board 30 is formed from silicon, and as such, is a silicon wafer board. Further, certain embodiments employ integrated circuits 32 that are formed from the same semiconductor material as the circuit board 30. Accordingly, both the integrated circuits 32 and the circuit board 30 may be silicon based in certain embodiments. Forming the integrated circuits 32 and the circuit board 30 from the same semiconductor material maintains a common coefficient of thermal expansion (CTE) between the integrated circuits 32 and the circuit board 30 and maintains structural integrity as temperatures change because the integrated circuits 32 and the circuit board 30 expand and contract at the same rates. While indium is a particularly beneficial material used for the thermal interface 50, other materials such as thermally conductive epoxies and the like are envisioned.

Figure 4B:
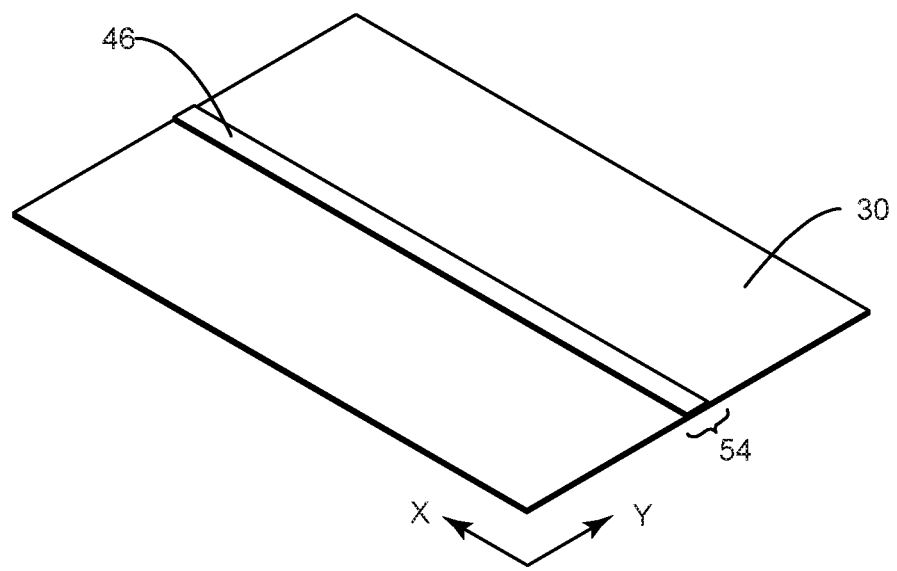
FIG. 4B is a bottom isometric view of a circuit board after forming the first thermal interface subsection according to one embodiment.

As illustrated in FIG. 4B, the indium strip that forms the first thermal interface subsection 46 is provided in the central portion 54 of the circuit board 30 relative to the Y axis. As illustrated, the first thermal interface subsection 46 extends along the entire length of the circuit board 30 along the X axis. The indium or other material being used for the first thermal interface subsection 46 may be applied using traditional deposition and etching processes, electroplating, tinning, or the like. The first thermal interface subsection 46 typically has a thickness between about 0.05 mm-0.3 mm and 0.1 mm-0.2 mm; however, thicknesses outside of this range are applicable.

Notably, the first thermal interface subsection 46 may take on any number of shapes in addition to the elongated and thin strip illustrated in FIG. 4B. However, employing a single strip that resides entirely within the central portion 54 of the circuit board 30 provides the most stress relief with respect to thermal expansion and contraction, as will be explained in more detail below.

Figure 5A:
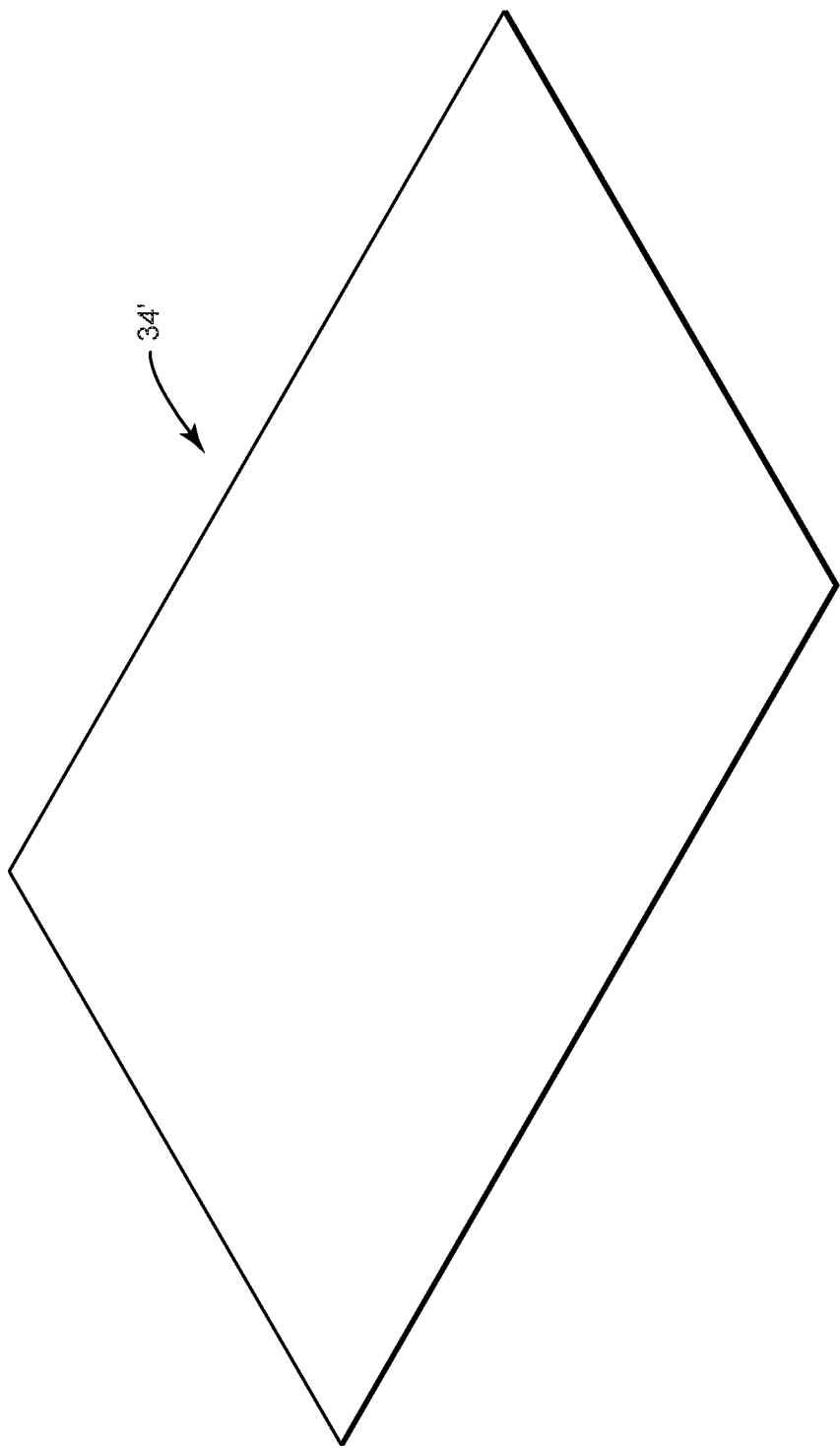
FIG. 5A is a top isometric view of a heat spreader prior to forming the thermal interface precursor according to one embodiment.
Figure 5C:
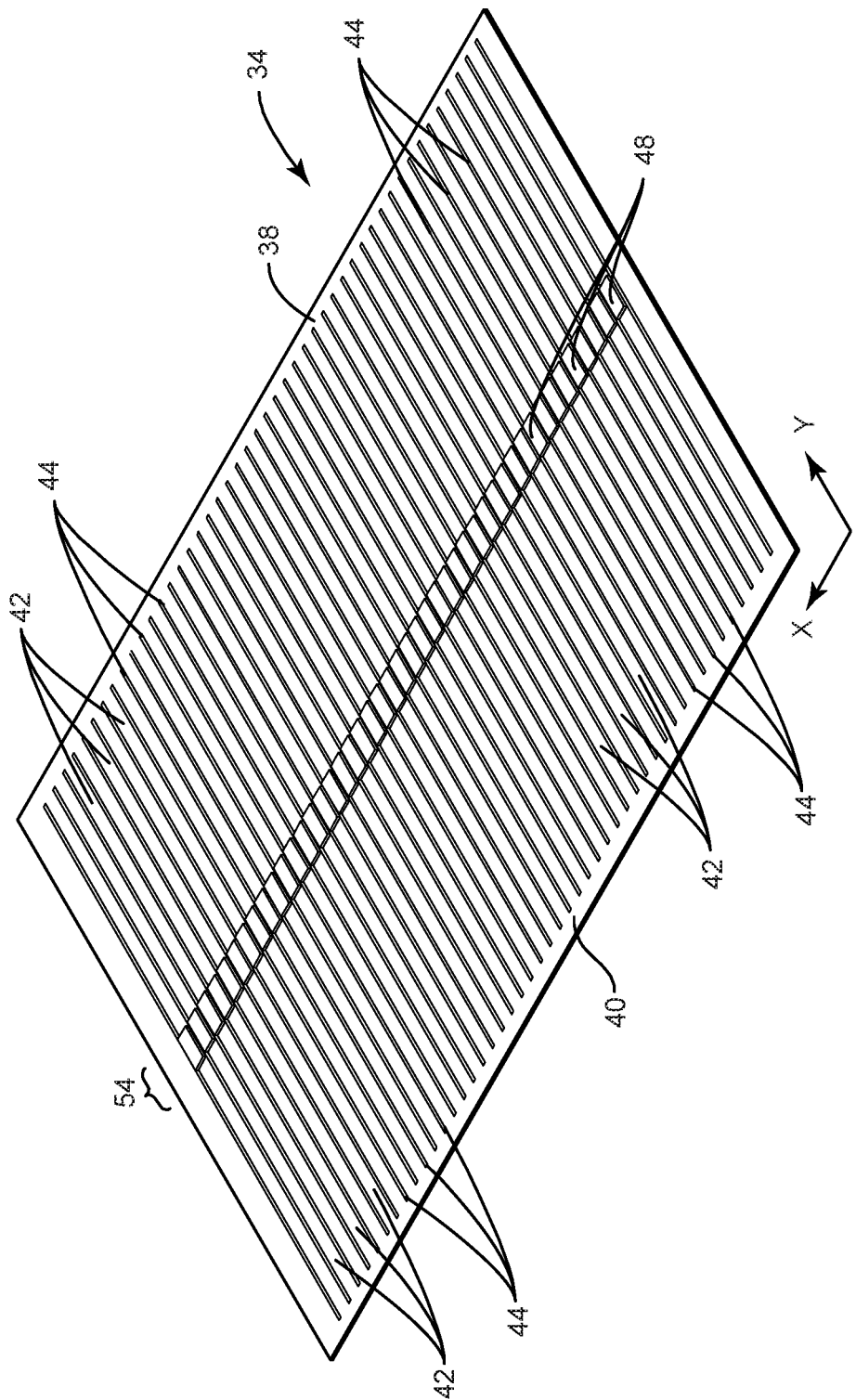
FIG. 5C is a top isometric view of a heat spreader after dicing the thermal interface precursor to form the second thermal interface subsection according to one embodiment.

FIGS. 5A-5C illustrate the preparation of the heat spreader 34 according to one embodiment. The heat spreader 34 is formed from a highly thermally conductive material, such as aluminum, copper, or the like. High purity aluminum is particularly beneficial given its superb ability to conduct heat. 4N (99.99% pure), 4N6 (99.996% pure), 5N5 (99.999% pure), 6N (99.9999% pure), or higher purity aluminum is particularly beneficial. The heat spreader 34 typically has a thickness between about 0.35 mm and 2 mm; however, thicknesses outside of this range are applicable.

FIG. 5A illustrates a heat spreader precursor 34'. To initiate the process of providing the second thermal interface subsection 48 on the heat spreader precursor 34', a strip of indium, thermal epoxy, or like material is provided across the vanes 42 in the X direction. The strip of indium is located in a central portion 54 of the heat spreader precursor 34' and will generally align with as well as mirror the shape and size of the first thermal interface subsection 46 that was formed on the circuit board 30 in FIG. 4B. With reference to FIG. 5B, the strip of indium is referred to as a thermal interface subsection precursor 48' and may be formed as a continuous strip that resides on top of the vanes 42. Forming the thermal interface subsection precursor 48' on the heat spreader 34 may include deoxidizing at least the area of the heat spreader 34 on which the thermal interface subsection precursor 48' is applied and then brushing liquid indium on the heat spreader precursor 34' to form the thermal interface subsection precursor 48'. A second process may include a multi-step process wherein the area on which the thermal interface subsection precursor 48' is to be formed is initially zincated to form a layer of zinc. The zinc layer is then flashed with copper to form a thin layer of copper of the zinc layer. Finally, the zinc layer is electroplated with indium to form an indium layer. The overall thermal interface subsection precursor 48' typically has a thickness between about 1 μm and 3 μm; however, thicknesses outside of this range are applicable.

Next, the thermal interface subsection precursor 48' is diced at each slot 44 to effectively break the thermal interface subsection precursor 48' into segmented components to form the second thermal interface subsection 48 and form the slots 44 in the heat spreader precursor 34' to form the heat spreader 34 shown in FIG. 5C. Multiple vanes 42 extend between the first and second bars 38 and 40. As illustrated, the vanes 42 are linear and substantially parallel to one another. The vanes 42 are separated by the slots 44. The thermal interface precursor 48' may be diced with a water jet. Other mechanical or chemical etching, material removal, or the like techniques may be employed to dice, slice, or otherwise separate the thermal interface subsection precursor 48' into the segmented components of the second thermal interface subsection 48.

Figure 6:
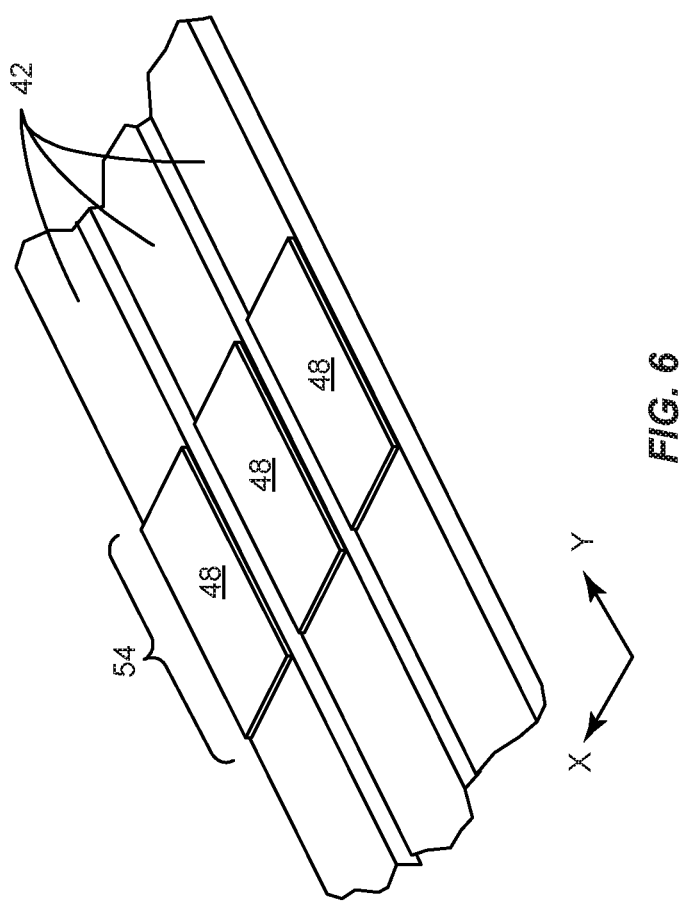
FIG. 6 is an enlarged view of a portion of the heat spreader of FIGS. 5A-5C.

Each component of the second thermal interface subsection 48 resides directly on a corresponding vane 42, as illustrated in FIG. 6. As such, each component of the second thermal interface subsection 48 is spaced apart from the others. With continued reference to FIG. 6, the segments of the second thermal interface subsection 48 correspond to the contact patch that the thermal interface 50 will provide for each vane 42.

In one embodiment, the circuit board 30 is approximately 160 mm×240 mm, and the indium-based thermal interface 50 is approximately 10 mm×240 mm. The thermal interface 50 may be linear or non-linear and take on any variety of shapes. In certain embodiments, the thermal interface 50 is an elongated strip that has length of at least 10 times, 15 times, or 20 times its width. The contact patches of the thermal interface 50 to each of the vanes 42 are approximately 5 mm×10 mm. These dimensions are merely exemplary for one embodiment; however, it is particularly beneficial for the contact patches to be equal to or less than 20 mm×20 mm, 15 mm×15 mm, or 12 mm×12 mm. Maintaining smaller contact patches allows the thermal interface 50 to better absorb stress of the heat spreader 34 expanding and contracting at a much higher rate than the circuit board 30.

Figure 7A:
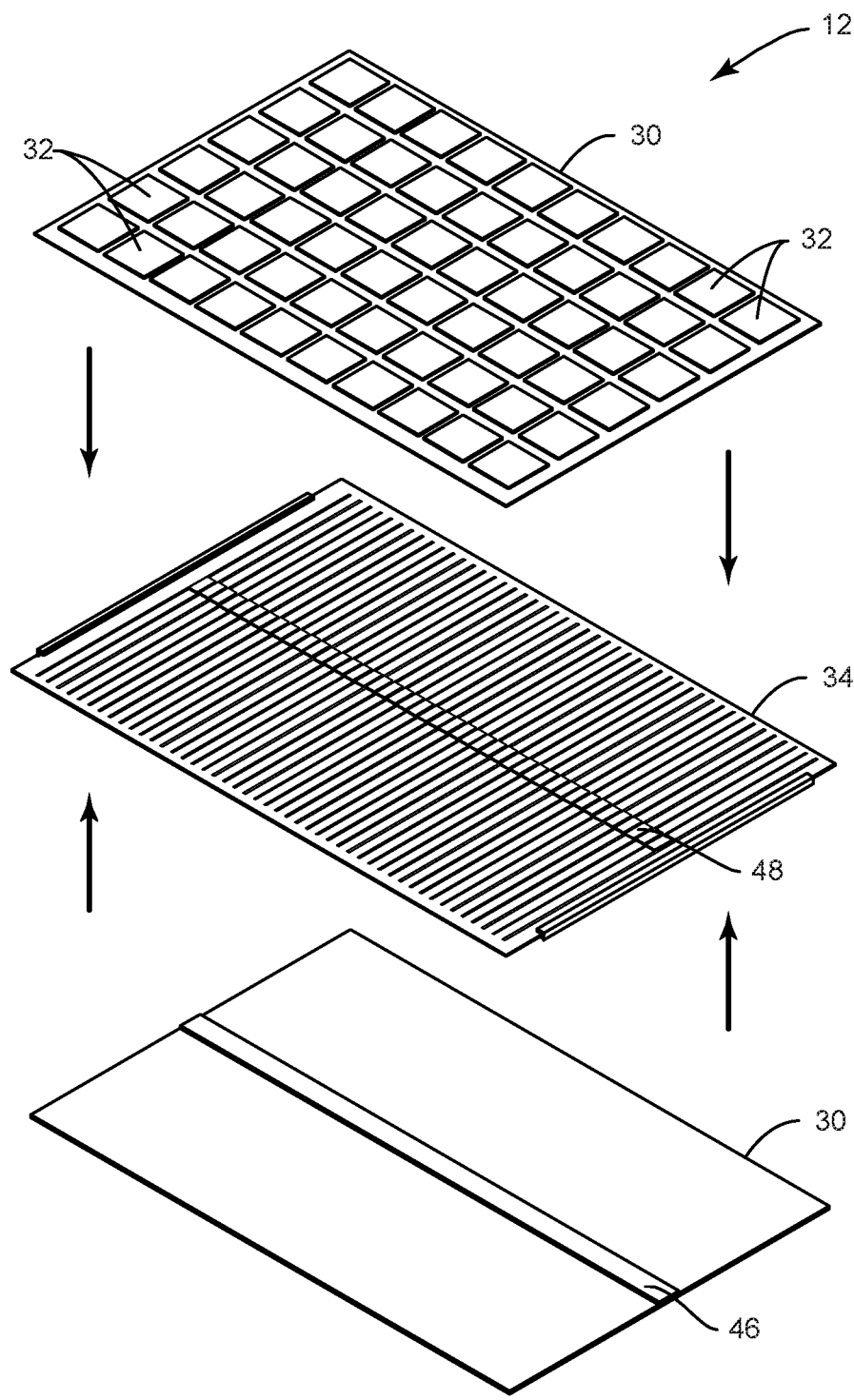
FIG. 7A illustrates two circuit boards and the heat spreader prior to attaching the two circuit boards to the heat spreader according to one embodiment.
Figure 7B:
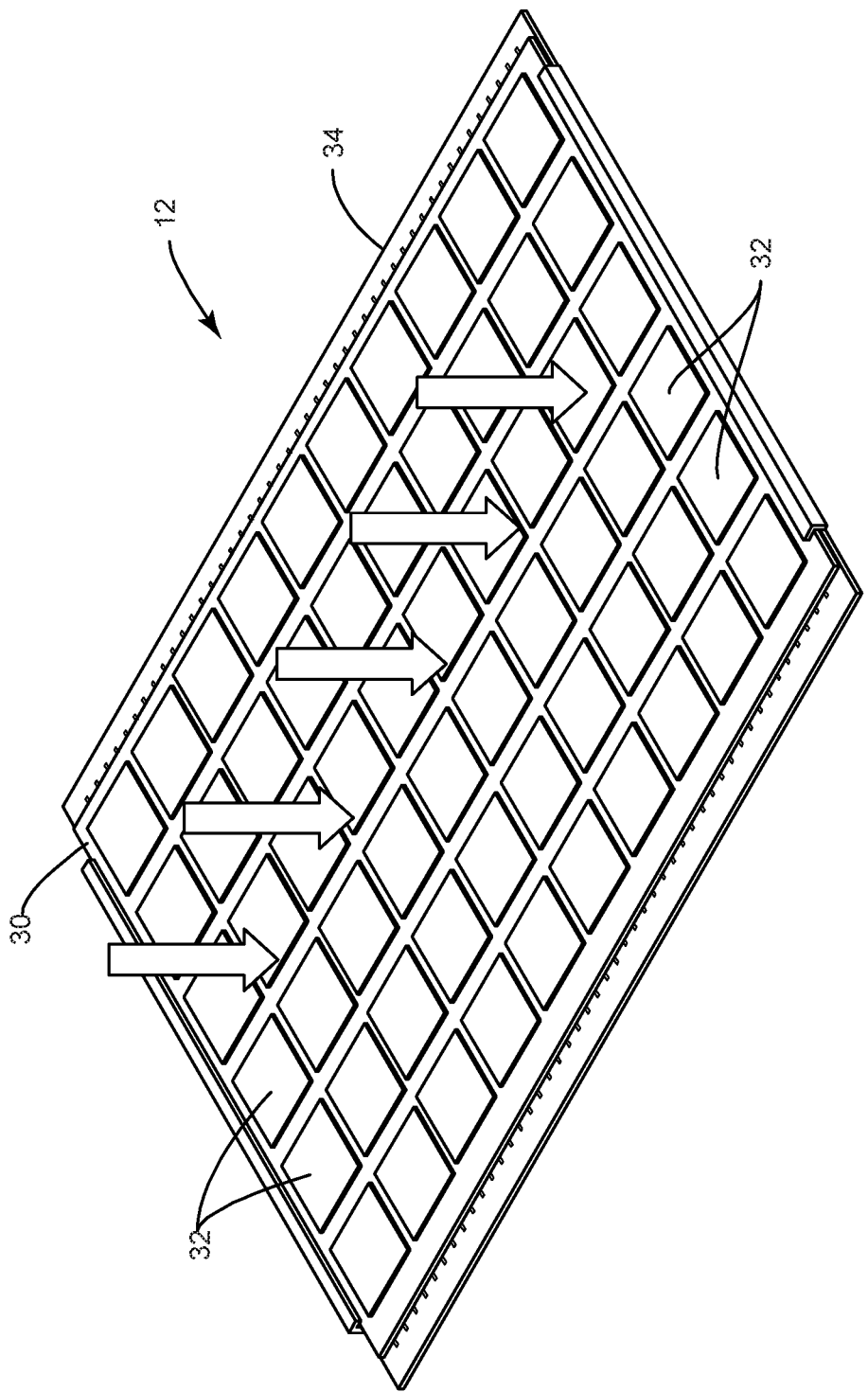
FIG. 7B illustrates applying pressure to attach the two circuit boards to the heat spreader according to one embodiment.

FIGS. 7A and 7B illustrate assembly of the blade assembly 12 in an embodiment wherein a circuit board 30 on both sides of the heat spreader 34. Initially, the circuit boards 30 are aligned with the respective sides of the heat spreader 34, such that the first thermal interface subsections 46 of the circuit boards 30 align with the second thermal interface subsections 48 of the heat spreader 34. The circuit boards 30 are moved into contact with the respective sides of the heat spreader 34, such that the first thermal interface subsection and the second thermal interface subsection 46, 48, which are formed from numerous individual components, contact each other. The first and second thermal interface subsections 46, 48 are then bonded together.

In an exemplary process, the first thermal interface subsection 46 and the second thermal interface subsection 48 are bonded together using a cold bonding process. The cold bonding process is particularly applicable for applications wherein the first thermal interface subsection 46 and the second thermal interface subsection 48 employ indium, a thermal epoxy, or the like. The process simply includes applying pressure to the circuit boards 30 and/or the heat spreader 34 such that the first thermal interface subsection 46 and the second thermal interface subsection 48 are pressed against each other at or near room temperatures, such that bonding occurs between the first thermal interface subsection 46 and the second thermal interface subsection 48 to form the composite thermal interface 50. Other bonding techniques may be employed and may require heat, additional materials or layers, or the like. However, maintaining a uniform, highly thermally conductive material as the thermal interface 50 tends to provide the least thermal resistance. The resulting thermal interface 50 typically has a thickness between about 0.05 mm and 0.3 mm; however, thicknesses outside of this range are applicable.

Figure 8A:
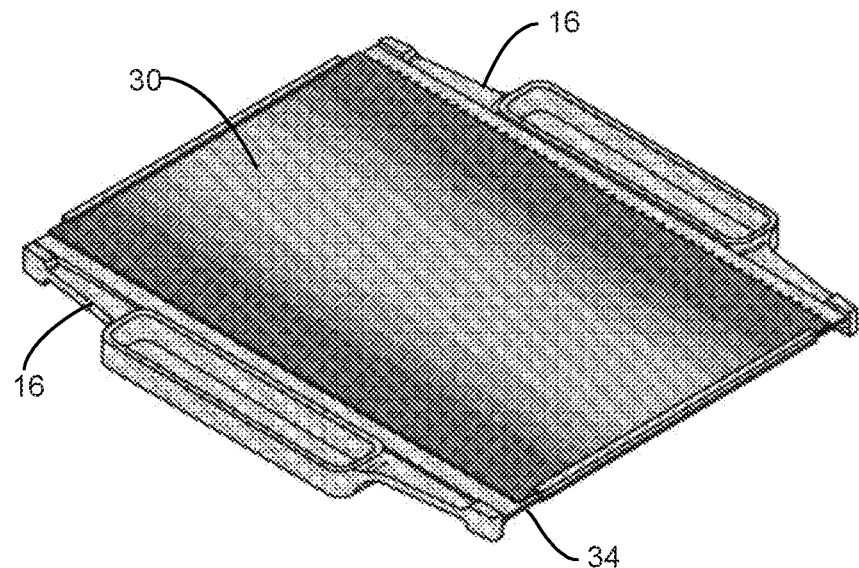
FIG. 8A illustrates a thermal gradient for a circuit board of a blade assembly according to one embodiment.
Figure 8B:
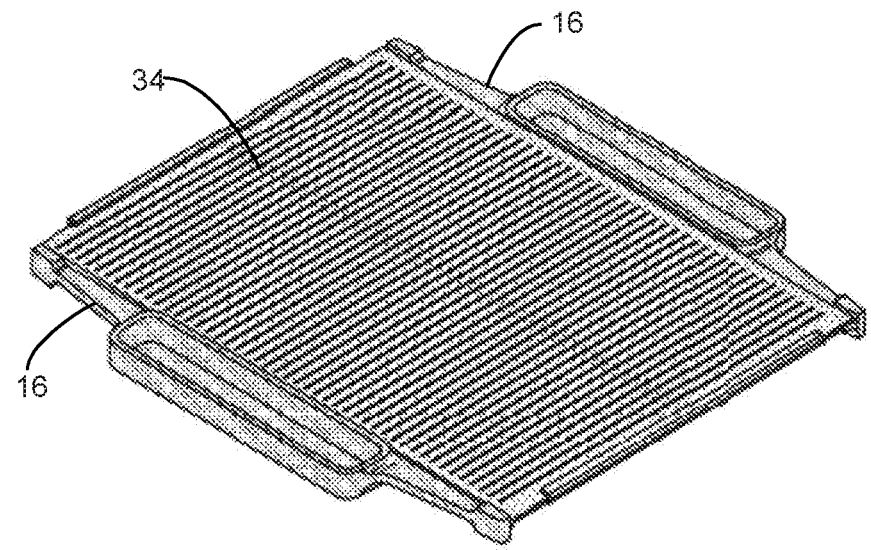
FIG. 8B illustrates a thermal gradient for a heat spreader of a blade assembly according to one embodiment.

FIGS. 8A and 8B illustrate the thermal gradient across a 1 mm thick silicon circuit board 30, wherein the contact patches for the thermal interface 50 are approximately 4 mm×10 mm. The thermal interface 50 consists essentially of indium, and the heat spreader 34 is made of 5N5 aluminum (at least 99.999% Al) and is approximately 1 mm thick.

Figure 9:
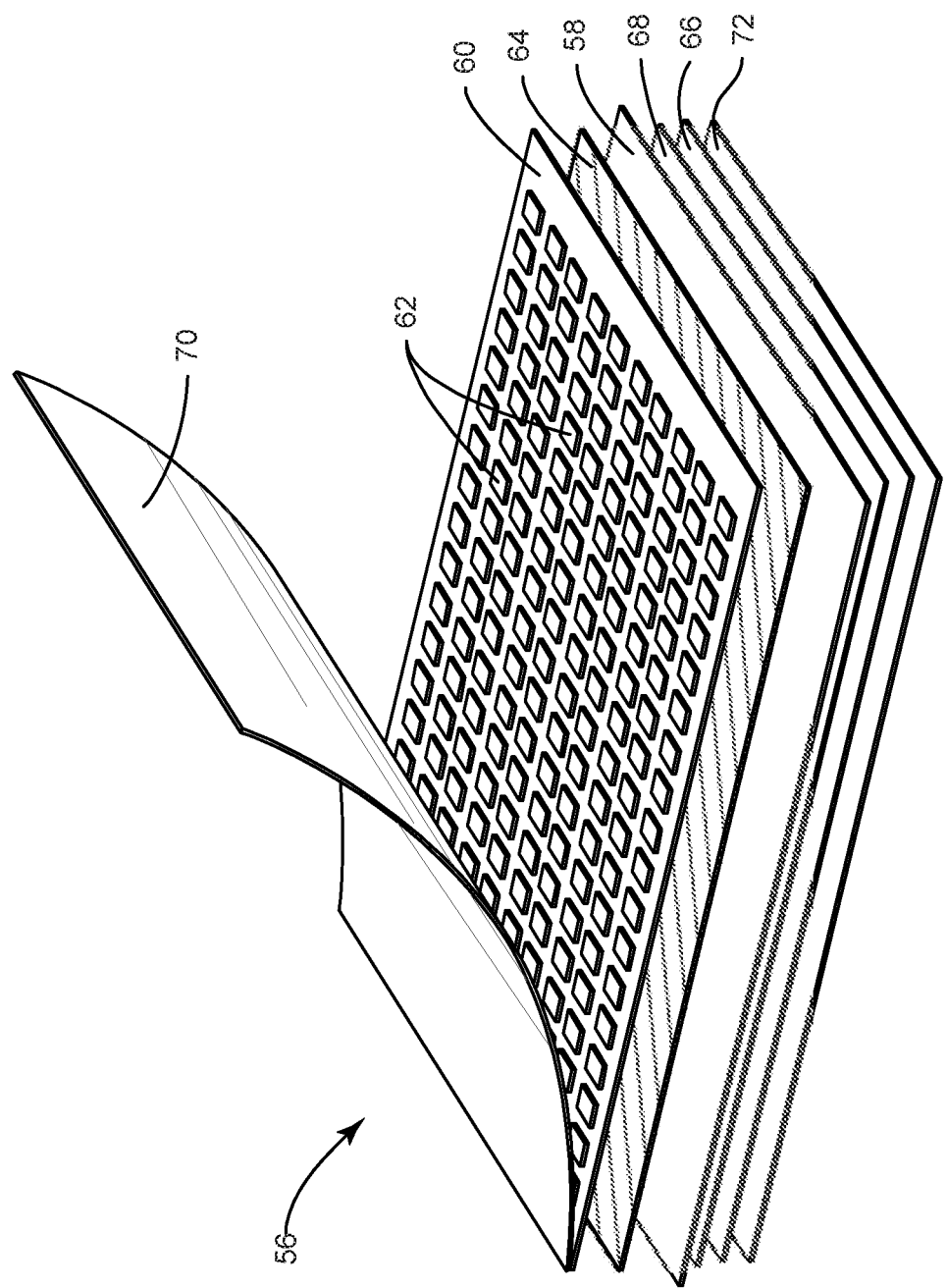
FIG. 9 is a partially exploded isometric view of a blade assembly according to a first alternate embodiment.

Turning now to FIG. 9, an alternative blade assembly 56 is illustrated. In this embodiment, a solid heat spreader 58, as opposed to the heat spreader 34 with vanes 42 and slots 44 resides at the center of the blade assembly 56. A first circuit board 60 with integrated circuits 62 is mounted over a top surface of the heat spreader 58, wherein a first heat preform 64 is sandwiched between the top surface of the heat spreader 58 and the first circuit board 60. Similarly, a second circuit board 66 resides over a bottom surface of the heat spreader 58, wherein a second heat preform 68 resides between the bottom surface of the heat spreader 58 and the second circuit board 66.

Notably, the surfaces of the first and second circuit boards 60, 66 that include the integrated circuits 62 face away from the heat spreader 58. Accordingly, the integrated circuits 62 of the first circuit board 60 are on a top surface of the first circuit board 60. The integrated circuits 62 of the second circuit board 66 are on a bottom surface of the second circuit board 66. Further, a first spring sheet 70 is placed over the top surface of the first circuit board 60 such that the first spring sheet 70 rests against the top surface of the integrated circuits 62. Similarly, a second spring sheet 72 rests against the integrated circuits 62 of the second circuit board 66. In one embodiment, the heat spreader 58 is formed from a high purity aluminum, like the heat spreader 34 in the prior embodiments. As noted above, the heat spreader 58 is a solid sheet of aluminum that does not include vanes, slots, holes, or the like in the illustrated embodiment. Such features may be provided in the heat spreader 58, but may reduce cooling efficiencies. Further, the heat spreader 58 may be formed from copper, high purity aluminum, or other highly thermally conductive material. The first and second heat preforms 64, 68 are formed from indium in one embodiment, but other highly thermally conductive material may be employed. The first and second spring sheets 70, 72 are formed from sheets of beryllium copper (BeCu) in the illustrated embodiment, but may also be formed from stainless or carbon steel, or like highly conductive material.

In this embodiment, there is direct conduction cooling through the back surfaces (those closest to the heat spreader 58) of the circuit boards 60, 66. The first and second heat preforms 64, 68 are unbonded, and provide thermal conductance between the first and second circuit boards 60, 66 and the respective surfaces of the heat spreader 58. The first and second spring sheets 70, 72 function to provide a compressive load between the first and second circuit boards 60, 66, the first and second heat preforms 64, 68, and the heat spreader 58. This design is compatible with the clam shell configuration required by the cooling chassis 10 and helps to eliminate the thermal gradient across the first and second circuit boards 60, 66.

Figure 10:
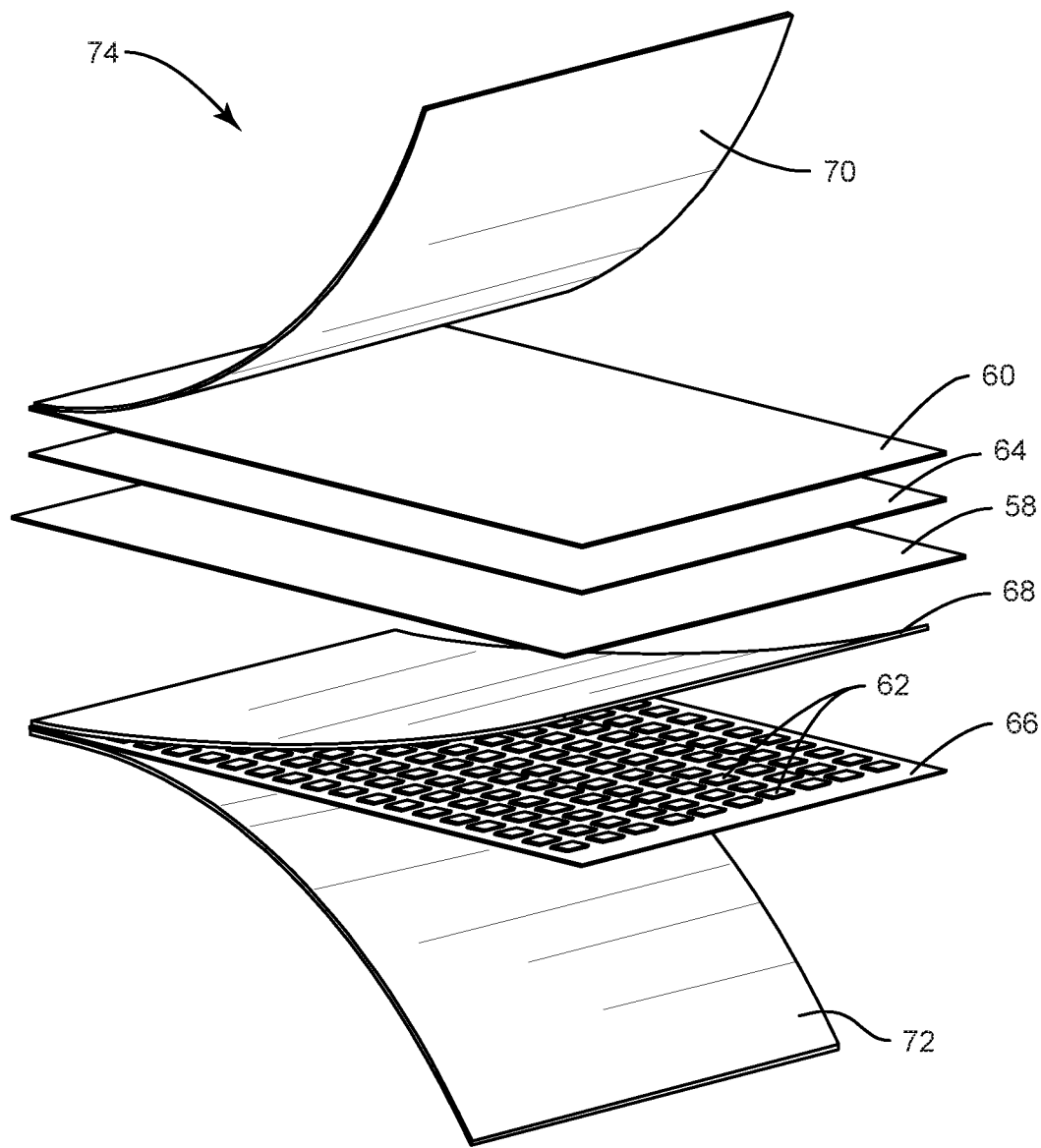
FIG. 10 is a partially exploded isometric view of a blade assembly according to a second alternate embodiment.

FIG. 10 illustrates another blade assembly 74, which is very similar to that illustrated in FIG. 9. The primary difference is that the first and second circuit boards 60, 66 are flipped such that the integrated circuits 62 rest against the first and second heat preforms 64, 68. As such, direct conduction cooling is provided through the integrated circuits 62 to the first and second heat preforms 64, 68. The unbonded first and second heat preforms 64, 68 provide compliance from the exposed surfaces of the integrated circuits 62 on the respective first and second circuit boards 60, 66 to the heat spreader 58. Again, this design is compatible with the clam shell configuration used by the cooling chassis 10. The composition of the respective components is the same or similar to that described in association with the blade assembly 56 of FIG. 9.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   at least one integrated circuit;
   a circuit board formed from a semiconductor material and comprising a first board surface on which the at least one integrated circuit is mounted and a second board surface opposite the first board surface;
   a heat spreader of a thermally conductive material and comprising a plurality of vanes that are spaced apart from one another; and
   a thermal interface coupled between at least one area of the second board surface of the circuit board and a contact area of each of the plurality of vanes, wherein heat generated by the at least one integrated circuit is conducted from the at least one integrated circuit to the plurality of vanes of the heat spreader through the circuit board and the thermal interface.

2. The apparatus of claim 1 wherein the contact area for each of the plurality of vanes is the only portion of the thermal interface in contact with the heat spreader.

3. The apparatus of claim 2 wherein the thermal interface is an elongated strip that resides exclusively within a central portion of the second board surface that extends along a first axis.

4. The apparatus of claim 3 wherein the plurality of vanes of the heat spreader are substantially parallel with one another and a second axis that is substantially orthogonal to the first axis.

5. The apparatus of claim 4 wherein thermal interface is at least 75% indium.

6. The apparatus of claim 5 wherein the elongated strip is linear.

7. The apparatus of claim 1 wherein the at least one integrated circuit is formed from the semiconductor material.

8. The apparatus of claim 7 wherein the semiconductor material is silicon.

9. The apparatus of claim 1 further comprising a first chassis wall and a second chassis wall wherein each of the plurality of vanes extends between the first chassis wall and the second chassis wall and are thermally coupled to both of the first chassis wall and the second chassis wall.

10. The apparatus of claim 9 comprising at least one tube and wherein:
    the first chassis wall has a first opening, and the second chassis wall has a second opening; and
    the first opening and the second opening are in fluid communication with one another via the at least one tube.

11. The apparatus of claim 1 wherein the heat spreader is at least 99.99% aluminum.

12. The apparatus of claim 11 wherein the thermal interface is at least 75% indium.

13. The apparatus of claim 1 wherein:
    the at least one integrated circuit is formed from the semiconductor material;
    the semiconductor material is silicon;
    the heat spreader is at least 99.99% aluminum;
    the contact area for each of the plurality of vanes is the only portion of the thermal interface in contact with the heat spreader.

14. The apparatus of claim 13 wherein the thermal interface resides exclusively within a central portion of the second board surface that extends along a first axis.

* * * * *